(12) United States Patent
Choi

(10) Patent No.: US 6,895,173 B2
(45) Date of Patent: May 17, 2005

(54) COMBINED DVD/CD DATA PROCESSOR

(75) Inventor: Hoon-Soon Choi, Seoul (KR)

(73) Assignees: Samsung Electronics Co., LTD, Suwon-si (KR); Nito Jushi Kogyo Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/131,693

(22) Filed: Aug. 10, 1998

(65) Prior Publication Data

US 2003/0077075 A1 Apr. 24, 2003

(30) Foreign Application Priority Data

Aug. 30, 1997 (KR) .............................................. 97-43697

(51) Int. Cl.[7] .............................. H04N 5/85; H04N 7/64
(52) U.S. Cl. ......................... 386/125; 386/113; 386/114
(58) Field of Search ............................. 386/34, 40, 45, 386/124, 125–126, 2, 21, 37, 47, 76, 113, 114, 123; 360/32, 49, 89, 46, 29; 714/762, 781, 782, 785; H04N 5/85, 7/64

(56) References Cited

U.S. PATENT DOCUMENTS

| | | | | |
|---|---|---|---|---|
| 5,323,367 A | * | 6/1994 | Tamura et al. ................. | 369/32 |
| 5,517,509 A | * | 5/1996 | Yoneda ....................... | 714/785 |
| 5,587,981 A | * | 12/1996 | Kamatani ................. | 369/44.26 |
| 5,699,434 A | * | 12/1997 | Hogan .......................... | 705/57 |
| 5,742,575 A | * | 4/1998 | Yamakawa et al. ...... | 369/53.22 |
| 5,875,164 A | * | 2/1999 | Yamakawa et al. ...... | 369/44.29 |
| 5,896,176 A | * | 4/1999 | Das et al. .............. | 375/240.15 |
| 5,898,709 A | * | 4/1999 | Imade et al. ................. | 235/437 |
| 5,901,125 A | * | 5/1999 | Doi .......................... | 369/53.22 |
| 5,963,705 A | * | 10/1999 | Kim et al. ................... | 386/126 |
| 5,970,208 A | * | 10/1999 | Shim .......................... | 386/126 |
| 5,986,985 A | * | 11/1999 | Kawamura et al. ...... | 369/44.27 |
| 5,988,872 A | * | 11/1999 | Jeong ...................... | 371/40.14 |
| 5,995,707 A | * | 11/1999 | Lee ............................. | 386/81 |
| 5,999,570 A | * | 12/1999 | Chaki ......................... | 375/281 |
| 6,021,102 A | * | 2/2000 | Seto et al. ............... | 369/53.23 |
| 6,044,484 A | * | 3/2000 | Chung ........................ | 714/766 |
| 6,072,757 A | * | 6/2000 | Tajiri ......................... | 369/53.2 |
| 6,072,758 A | * | 6/2000 | Tajiri ....................... | 369/53.22 |
| 6,072,759 A | * | 6/2000 | Maeda et al. ............ | 369/59.25 |
| 6,112,324 A | * | 8/2000 | Howe et al. ................ | 714/763 |
| 6,119,262 A | * | 9/2000 | Chang et al. ............... | 714/781 |
| 6,130,988 A | * | 10/2000 | Jeong ......................... | 386/125 |
| 6,151,442 A | * | 11/2000 | Ueno et al. ................... | 386/98 |
| 6,158,039 A | * | 12/2000 | Cho et al. ................... | 714/769 |
| 6,233,394 B1 | * | 5/2001 | Jeong et al. ................ | 386/126 |
| 6,282,367 B1 | * | 8/2001 | Cho et al. ................... | 386/126 |

FOREIGN PATENT DOCUMENTS

| | | | |
|---|---|---|---|
| WO | 94/14159 | * | 6/1994 |

* cited by examiner

*Primary Examiner*—Robert Chevalier
(74) *Attorney, Agent, or Firm*—Staas & Halsey LLP

(57) ABSTRACT

A combined DVD/CD (Digital Video Disk/Compact Disk) data processor used in a DVD/CD player. The DVD/CD data processor includes a PLL (Phase Locked Loop) to receive a pulse stream input to generate a PLL clock; a frame/ID synchronization detector to latch the pulse stream according to the PLL clock, to generate a symbol clock; a demodulator to EFM+ demodulate the pulse stream according to the symbol clock in a DVD mode, and EFM demodulate the pulse stream according to the symbol clock in a CD mode; an ECC demodulator to error-correct input data according to a predetermined code length and error correction range, the predetermined code length and error correction range having different values in the DVD and CD modes; a memory to store the demodulated data to provide the ECC demodulator with the demodulated data stored therein; a descrambler to descramble the error corrected data stored in the memory, in the DVD mode; and a CD audio processor to process the error corrected data stored in the memory, in the CD mode.

26 Claims, 5 Drawing Sheets

COMBINED DVD/CD DATA PROCESSOR

BACKGROUND OF THE INVENTION

1. Field of the Invention

The present invention relates to a DVD/CD player, and more particularly, to a combined DVD/CD data processor for use in the DVD/CD player.

2. Description of the Related Art

A DVD (Digital Video Disk) player includes optical and servo systems of which functions and structures are similar to those used in a CD (Compact Disk) player. Therefore, in order to offer convenience to a user, there has been a demand for a DVD player compatible with the CD player.

FIG. 1 illustrates a schematic block diagram of a combined DVD and CD player according to the state of the art. As illustrated, a spindle motor 12 rotates a disk 10 which is a DVD or a CD. An optical pickup 14 reads an RF (Radio Frequency) signal from the disk 10, and an RF amplifier 16 converts the RF signal read by the pickup 14 into a pulse stream, to generate an EFM (Eight to Fourteen Modulated) signal. A microprocessor 20 sets the DVD/CD player to a DVD mode or a CD mode, according to lead-in information received from the RF amplifier 16. A data processor 18 processes the EFM signal according to the set operation mode.

FIG. 2 illustrates the data processor 18 according to the prior art. In operation, the EFM signal is applied in common to a phase locked loop (hereinafter, referred to as PLL)24, a DVD data processor 26, and a CD data processor 38. The PLL 24 generates a PLL clock in synchronism with the EFM signal. The PLL clock is used for reproducing data recorded on the disk 10.

If the microprocessor 20 sets the DVD/CD player to the DVD or the CD mode according to the lead-in information, one of the DVD data processor 26 and the CD data processor 38 is selectively driven.

The DVD data processor 26 includes a frame/ID (Identification) synchronization detector 28, an EFM+ (Eight to Fourteen Modulation Plus) demodulator 30, an RS (Reed-Solomon) decoder 34, an external memory 32, and a descrambler 36. The frame/ID synchronization detector 28 detects a synchronization pattern from the EFM signal to generate a symbol clock to the EFM+ demodulator 30. The EFM+ demodulator 30 EFM+ demodulates the EFM signal according to the symbol clock, and stores the demodulated data into the external memory 32. If the demodulated data stored in the external memory 32 becomes as large as an ECC (Error Checking and Correction) block size, the RS decoder 34 reads the demodulated data with the ECC block size and RS-decodes it to correct errors of the data. The error corrected data is stored back into the external memory 32. The descrambler 36 reads the error corrected data stored in the external memory 32 to descramble the read data and provide the same to an external ATAPI (AT Attachment Packet Interface). Here, in case the DVD/CD player is set to the DVD mode, the descrambled (output) data is applied to an AV (Audio-Visual) decoder.

The CD data processor 38 includes a frame/ID synchronization detector 40, an EFM demodulator 42, an internal memory 44, a deinterleaver 46, a CIRC (Cross Interleave Reed Solomon Code) decoder 48, and an audio processor 50. The frame/ID synchronization detector 40 detects the synchronization pattern from the EFM signal to generate a symbol clock to the EFM demodulator 42. The EFM demodulator 42 EMF-demodulates the EFM signal according to the symbol clock. The demodulated data is deinterleaved by the deinterleaver 46 and stored into the internal memory 44. If the demodulated and deinterleaved data stored in the internal memory 44 reaches a predetermined size, the CIRC decoder 48 reads the demodulated data from the internal memory 44 and CIRC-decodes it to correct errors of the data. The audio processor 50 processes the error corrected data.

As described above, the conventional DVD/CD player includes the DVD data processor 26 and the CD data processor 38 separately, and drives one of them according to the set operation mode, which results into an increase of the complexity of the device, as well as the manufacturing cost.

SUMMARY OF THE INVENTION

It is therefore an object of the present invention to provide a data apparatus for common use in a DVD/CD player using discrimination information provided according to a DVD or a CD. The data processor apparatus includes a signal pre-processor generating a clock from a pulse stream read from a disk and performing demodulation according to the discrimination information, a memory storing data processed by the signal pre-processor in a corresponding format according to the mode discrimination information, and a data processor error-correcting the data stored in the memory according to the discrimination information using a preset error correcting method.

It is another object of the present invention to provide a combined DVD and CD data processor for use in a DVD/CD player.

Additional objects and advantages of the invention will be set forth in part in the description which follows and, in part, will be obvious from the description, or may be learned by practice of the invention.

To achieve the above and other objects and advantages of the present invention, there is provided a combined DVD/CD data processor used in a DVD/CD player. The DVD/CD data processor includes a PLL to receive a pulse stream input to generate a PLL clock; a frame/ID synchronization detector to latch the pulse stream according to the PLL clock, to generate a symbol clock; a demodulator to EFM+ demodulate the pulse stream according to the symbol clock in a DVD mode, and to EFM demodulate the pulse stream according to the symbol clock in a CD mode; a memory to store the demodulated data; an ECC demodulator to error-correct the demodulated data stored in the memory according to a predetermined code length and error correction range, the predetermined code length and error correction range having different values in the DVD and CD modes; a descrambler to descramble the error corrected data stored in the memory, in the DVD mode; and a CD audio processor to process the error corrected data stored in the memory, in the CD mode.

BRIEF DESCRIPTION OF THE DRAWINGS

These and other objects and advantages of the present invention will become more apparent by describing in detail a preferred embodiment thereof, with reference to the attached drawings in which.

DETAILED DESCRIPTION OF THE PREFERRED EMBODIMENT

Figure 1:
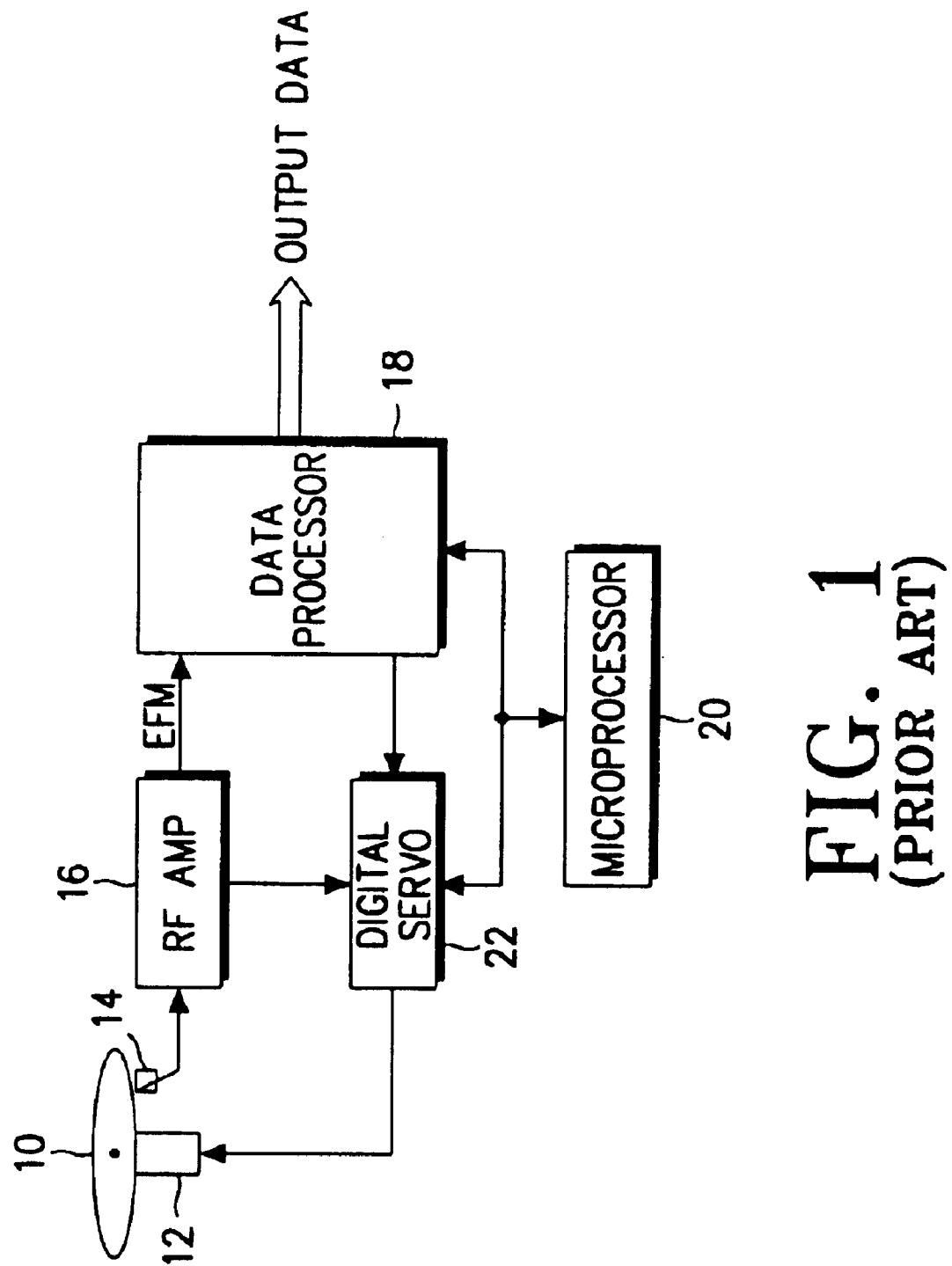
FIG. 1 is a schematic block diagram of a general DVD/CD player.
Figure 2:
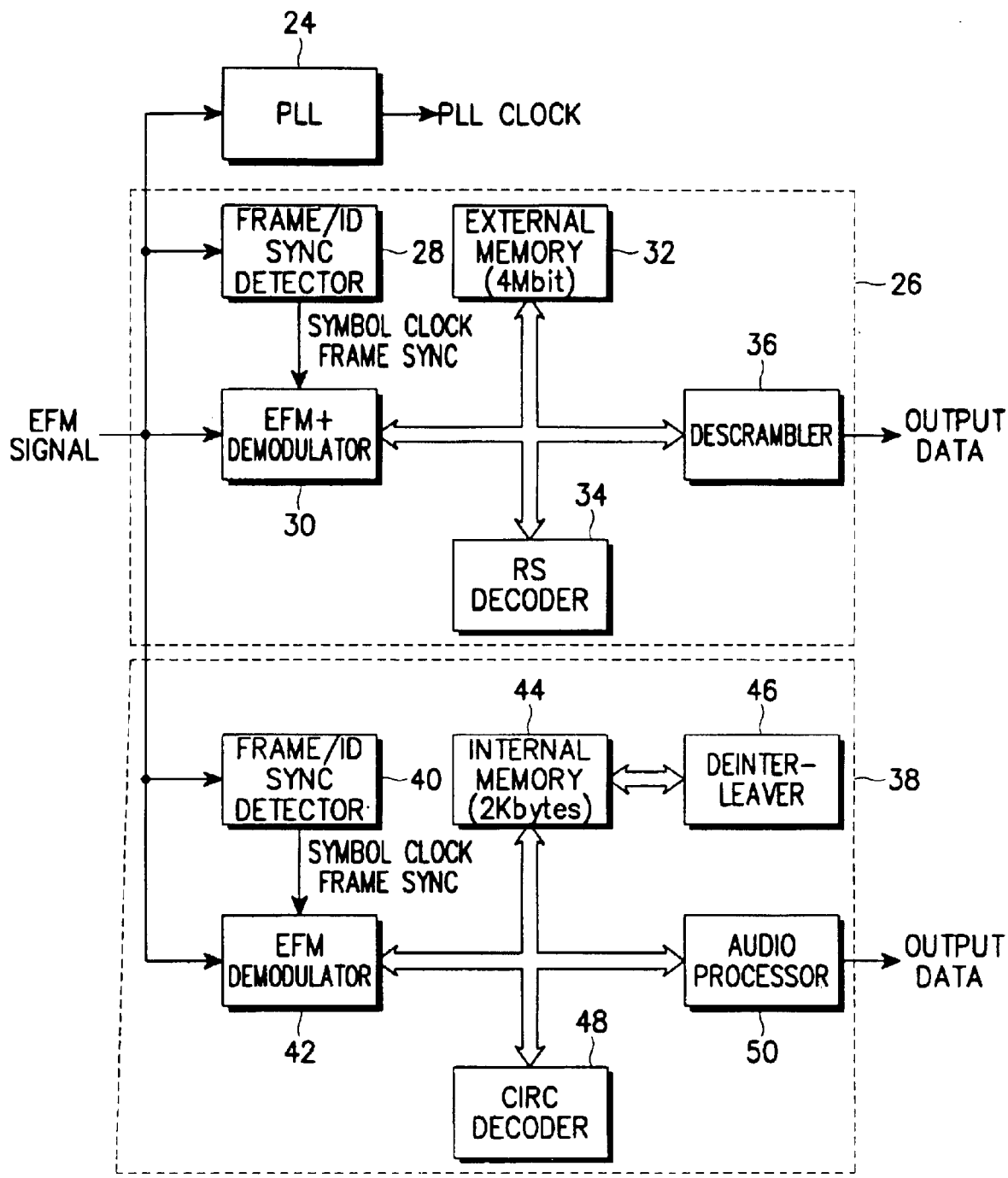
FIG. 2 is a detailed block diagram of a data processor of FIG. 1 according to the prior art.

A preferred embodiment of the present invention will be described in detail, and it should be noted that like reference numerals denote the same components, and a detailed description of known function and structure of the present invention will be avoided if it is deemed to obscure the subject matter of the present invention.

A combined DVD/CD data processor according to the present invention is applicable to the DVD/CD player shown in FIG. 1, and the microprocessor 20 provides the DVD/CD data processor (the data processor 18 in FIG. 1) with mode setting information for setting the DVD or CD mode.

Figure 3:
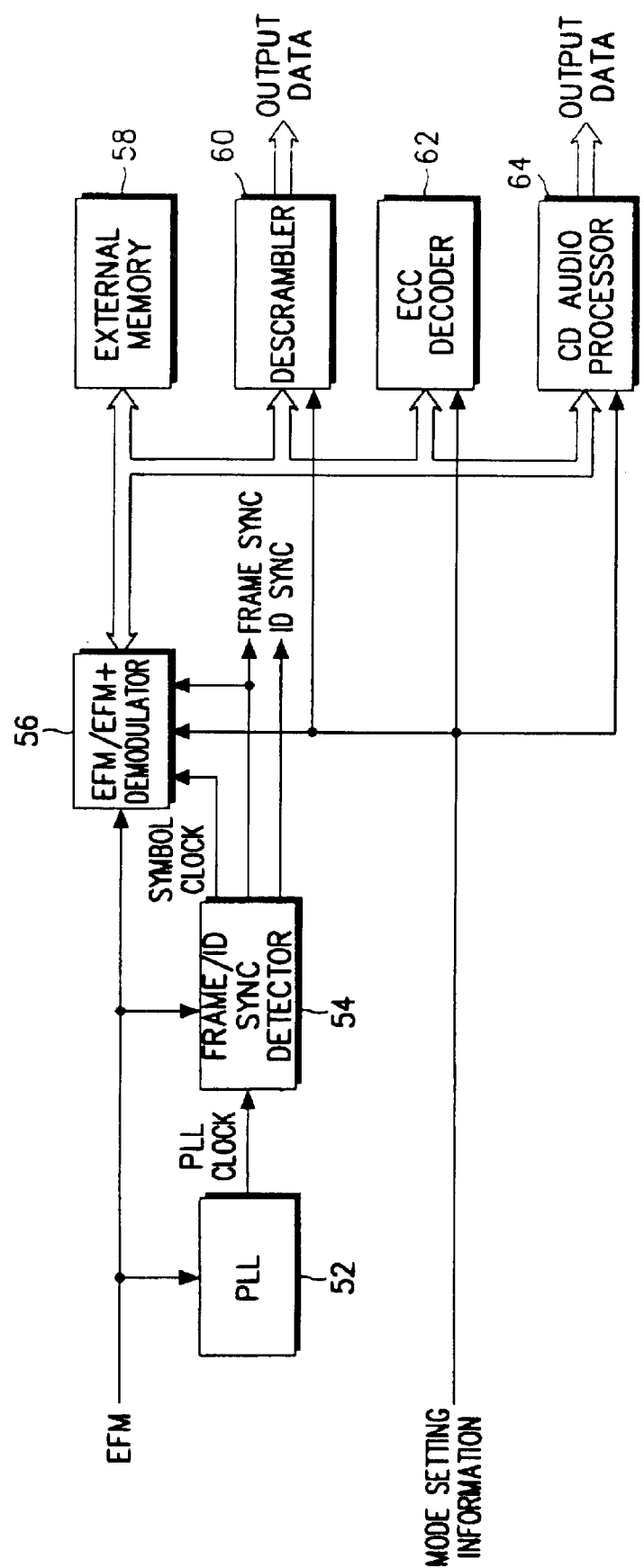
FIG. 3 is a detailed block diagram of a data processor according to an embodiment of the present invention.

Referring to FIG. 3, the DVD/CD data processor according to an embodiment of the present invention includes a PLL 52, a frame/ID synchronization detector 54, an EFM/EFM+ demodulator 56, an external memory 58 including a DRAM (dynamic random access memory), a descrambler 60, an ECC decoder 62, and a CD audio processor 64.

Here, the PLL 52, the frame/ID synchronization detector 54, and the EFM/EFM+ demodulator 56 constitute a signal pre-processor, and the ECC, decoder 62, the CD audio processor 64 and the descrambler 60 constitute a data processor and converter, wherein the ECC decoder 62 constitutes an error corrector.

The PLL 52 receives the EFM signal from the RF amplifier 16 to generate a PLL clock for restoring data, in synchronism with the received EFM signal. The frame/ID synchronization detector 54 latches the EFM signal according to the PLL clock, and detects frame synchronization and ID synchronization signals to generate a symbol clock. The EFM/EFM+ demodulator 56 selectively performs EFM or EFM+ demodulation according to the mode setting information generated from the microprocessor 20. That is, if the mode setting information indicates the DVD mode (the microprocessor 20 controls the combined DVD/CD data processor to set the DVD/CD player to a DVD mode or a CD mode according to lead-in information received from the RF amplifier 16 and provides the mode setting information for the EFM/EFM+ demodulator 56, the ECC decoder 62 and the CD audio processor 64), the EFM/EFM+ demodulator 56 EFM+ demodulates the EFM signal according to the symbol clock. On the contrary, if the mode setting information indicates the CD mode, the EFM/EFM+ demodulator 56 EFM demodulates the EFM signal according to the symbol clock. Such demodulated data is stored into the external memory 58.

The external memory 58, under the control of a memory controller (not shown), stores EFM+ demodulated data provided from the EFM/EFM+ demodulator 58 to provide the demodulated data to the ECC decoder 62, and stores the error-corrected data output from the ECC decoder 62, in the DVD mode of operation. In addition, in the CD mode of operation, the external memory 58, under the control of the memory controller, stores the EFM demodulated data to provide the decoded data to the ECC decoder 62, and stores the error-corrected data output from the ECC decoder 62. Here the memory controller controls the external memory 58 according to mode setting information provided from the microprocessor 20.

Figure 4:
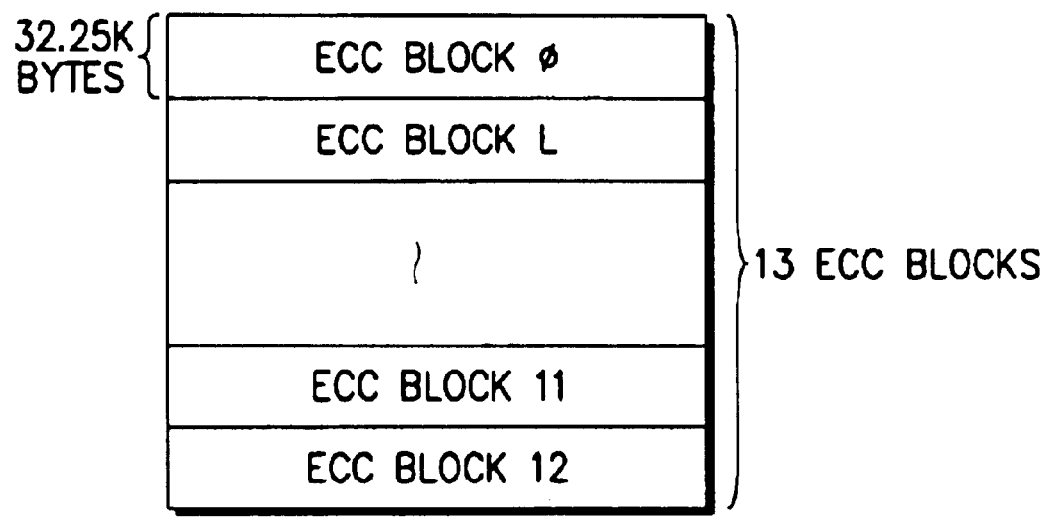
FIGS. 4 and 5 are diagrams illustrating memory maps of an external memory of FIG. 3 according to the embodiment of the present invention.
Figure 5:
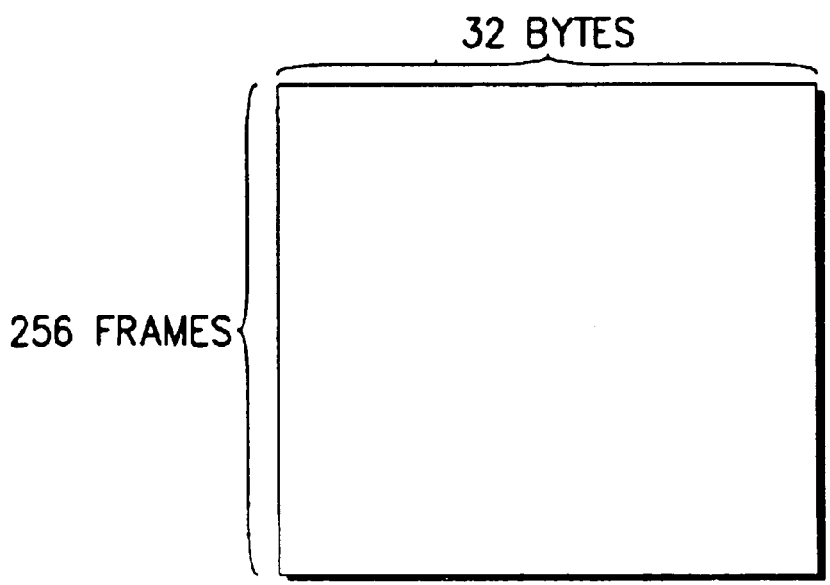

The external memory 58 has a memory map as shown in FIGS. 4 and 5. In the DVD mode, the external memory 58 has 13 ECC blocks each having 32.25-K bytes to store 13 ECC blocks, as shown in FIG. 4. The external memory 58 is configured to provide a VBR (Variable Bit Rate) control margin for interfacing VBR coded AV data with an AV decoder (not shown). In the CD mode, a specified part, i.e., 32 bytes×256 frames, of the external memory 58 is used, as shown in FIG. 5.

Referring back to FIG. 3, the ECC decoder 62 reads and corrects the data stored in the external memory 58 according to the mode setting information. The ECC decoder 62 has a construction as shown in FIG. 6.

Figure 6:
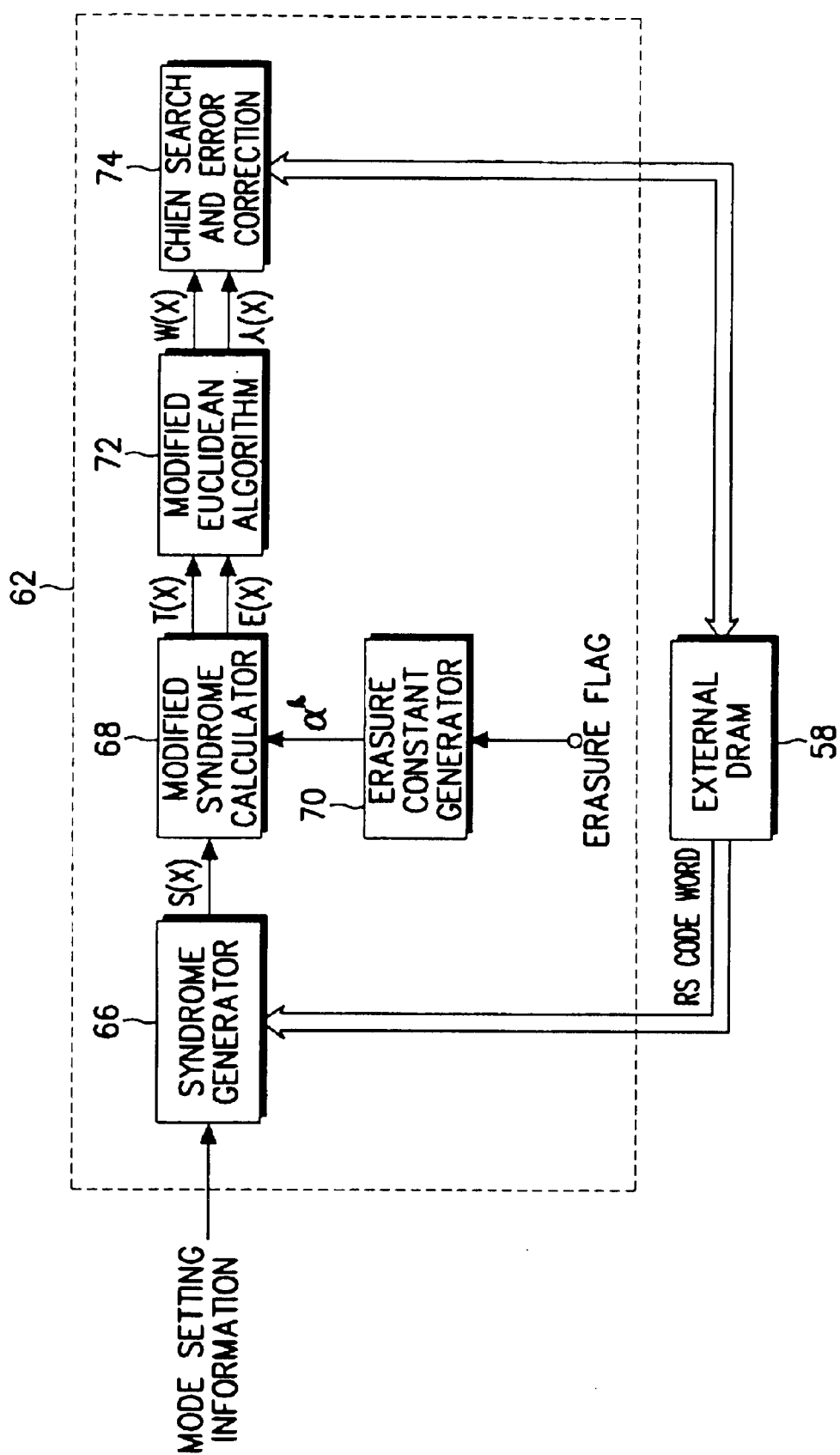
FIG. 6 is a detailed block diagram of an ECC decoder shown in FIG. 3 according to the embodiment of the present invention.

Referring to FIG. 6, the ECC decoder 62 includes a syndrome generator 66, a modified syndrome calculator 68, an erasure constant generator 70, a modified Euclidean algorithm 72, and a Chien search and error correction circuit 74.

In the DVD mode, the syndrome generator 66 sets a code length and a correction range to PI(182,172), PO(208,192) and thereafter, receives data from the external memory 58 to generate a syndrome polynomial S(X). In the CD mode, the syndrome generator 66 sets the code length and correction range to C1(32,28), C2(28,24) and thereafter, receives the data from the external memory 58 to generate the syndrome polynomial S(X). The generated syndrome polynomial S(X) is applied to the modified syndrome calculator 68. The erasure constant generator 70 is provided with an erasure flag to generate an erasure constant $a^k$ to the modified syndrome calculator 68. The modified syndrome calculator 68 receives the syndrome polynomial S(X) and the erasure constant $a^k$ to calculate a Forney syndrome polynomial T(X) and an erasure locator polynomial E(X). The calculated Forney syndrome polynomial T(X) and erasure locator polynomial E(X) are applied to the modified Euclidean algorithm 72. The modified Euclidean algorithm 72 processes the Forney syndrome polynomial T(X) and the erasure locator polynomial E(X) based on the modified Euclidean algorithm, to generate an errata locator polynomial W(X) and an errata evaluator polynomial Λ(X). The Chien search and error correction circuit 74 receives the errata locator polynomial W(X) and the errata evaluator polynomial Λ(X) to correct errors of the corresponding data and store the error corrected data back into the external memory 58.

Since the primitive polynomials for error-correcting the DVD data and the CD data are the same to each other, it is possible to correct the DVD and CD data by controlling only the data received from the syndrome generator 66, with use of the single ECC decoder 62. The primitive polynomial P(X) is represented by:

$$P(X)=x^8+x^4+x^3+x^2+1 \qquad (1)$$

That is, the primitive polynomials for correcting the DVD and CD data are the same to equation (1), and merely, the code lengths and correction ranges of the DVD and CD data to be error-corrected are different from each other. Therefore, by simply controlling the code length and the correction range of the input data according to the set mode, it is possible to correct errors of the DVD and CD data through the use of the single ECC decoder 62.

Referring again to FIG. 3, in the case that the DVD/CD player is set to the DVD mode, the descrambler 60 is enabled to descramble the error corrected data stored in the external memory 58 and provide the descrambled output data to the ATAPI (not shown) or the AV decoder (not shown).

In case the DVD/CD player in set to the CD mode, the CD audio processor 64 is enabled to processes the error corrected data stored in the external memory 58.

As can be appreciated from the foregoing, the DVD/CD data processor according to the present invention includes a single ECC decoder for correcting both the DVD and CD data, and a single external memory. Therefore, the DVD/CD data processor is simple in structure, thereby resulting in a decrease of the manufacturing cost.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A combined DVD (Digital Video Disk)/CD (Compact Disk) data processor to process a pulse stream of data from a DVD or a CD, comprising:
    a demodulator to EFM+ demodulate the pulse stream in a DVD mode, and EFM demodulate the pulse stream in a CD mode, to generate demodulated data;
    a single ECC (error checking and correction) decoder to error-correct the demodulated data according to a predetermined code length and error correction range, the predetermined code length and error correction range having different values in the DVD and CD modes, to generate error corrected data; and
    a memory to store the error corrected data from said ECC decoder, wherein said memory comprises a first memory map including a plurality of blocks of the error corrected data each having a first fixed number of bytes in the DVD mode, and a second memory map including a plurality of frames of the error corrected data each having a second fixed number of bytes in the CD mode.

2. The combined DVD/CD data processor as claimed in claim 1, wherein the predetermined code length and error correction range in the DVD mode are PI(182,172), PO(208, 192), and the predetermined code length and error correction range in the CD mode are C1(32,28), C2(28,24).

3. A combined DVD (Digital Video Disk)/CD (Compact Disk) data processor to process a pulse stream of data from a DVD or a CD, comprising:
    a demodulator to EFM+ demodulate the pulse stream in a DVD mode, and EFM demodulate the pulse stream in a CD mode, to generate demodulated data;
    an ECC (error checking and correction) decoder to error-correct the demodulated data stored according to a predetermined code length and error correction range, the predetermined code length and error correction range having different values in the DVD and CD modes, to generate error corrected data; and
    a memory to store the demodulated data and the error corrected data, wherein said memory comprises a first memory map including a plurality of blocks of the error corrected data each having a first fixed number of bytes in the DVD mode, and a second memory map including a plurality of frames of the error corrected data each having a second fixed number of bytes in the CD mode, wherein said ECC decoder comprises;
        a syndrome generator to receive said demodulated data from said memory to generate a syndrome polynomial according to a code length and correction range of PI(182,172), PO(208,192) in the DVD mode, and of C1(32,28), C2(28,24) in the CD mode;
        an erasure constant generator to receive an erasure flag to generate an erasure constant;
        a modified syndrome calculator to receive the syndrome polynomial and the erasure constant to calculate a modified syndrome and generate a Forney syndrome polynomial and an erasure polynomial;
        a modified Euclidean algorithm to process the Forney syndrome polynomial and the erasure polynomial based on a modified Euclidean algorithm, to generate an errata locator polynomial and an errata evaluator polynomial; and
        a Chien search and error correction circuit to correct errors of the demodulated data stored in said memory according to said errata locator polynomial and said errata evaluator polynomial.

4. The combined DVD/CD data processor as claimed in claim 1, wherein said memory is an external memory.

5. A combined DVD (Digital Video Disk)/CD (Compact Disk) data processor to process a pulse stream of data from a DVD or a CD, comprising:
    a PLL (Phase Locked Loop) to receive the pulse stream, to generate a PLL clock;
    a frame/ID (identification) synchronization detector to latch the pulse stream according to said PLL clock, to generate a symbol clock;
    a single demodulator to EFM+ demodulate the pulse stream according to the symbol clock in a DVD mode, and EFM demodulate the pulse stream according to the symbol clock in a CD mode, to generate demodulated data;
    a memory to store the demodulated data from said demodulator;
    an ECC (error checking and correction) decoder to error-correct the demodulated data stored in said memory according to a predetermined code length and error correction range, the predetermined code length and error correction range having different values in the DVD and CD modes, to generate error corrected data;
    a descrambler to descramble the error corrected data stored in said memory, in the DVD mode; and
    a CD audio processor to process the error corrected data stored in said memory, in the CD mode, wherein:
        said memory comprises a first memory map including a plurality of blocks of the error corrected data each having a first fixed number of bytes in the DVD mode, and a second memory map including a plurality of frames of the error corrected data each having a second fixed number of bytes in the CD mode.

6. The combined DVD/CD processor as claimed in claim 5, wherein:
    the plurality of blocks is 13;
    the first fixed number of bytes is 32.25 Kbytes;
    the plurality of frames is 256; and
    the second fixed number of bytes is 32 bytes.

7. A combined DVD (Digital Video Disk)/CD (Compact Disk) data processor to process first and second pulse streams from a DVD and a CD, respectively, comprising:
    a PLL (Phase Locked Loop) to receive the first and second pulse streams, to generate respective first and second PLL clocks;
    a frame/ID (identification) synchronization detector to latch the first and second pulse streams according to the respective first and second PLL clocks, to generate respective first and second symbol clocks;
    a single demodulator to perform a first type of demodulation on the first pulse stream according to the first symbol clock to generate first demodulated data of a DVD mode, and a second type of demodulation on the second pulse stream according to the second symbol clock to generate second demodulated data of a CD mode;

a memory to store the first and second demodulated data; and an ECC (error checking and correction) decoder to error correct the first demodulated data stored in said memory in accordance with a first predetermined code length and error correction range and to store the error corrected first demodulated data back in said memory, and to error correct the second demodulated data stored in said memory in accordance with a second predetermined code length and error correction range and to store the error corrected second demodulated data back in said memory;

wherein said memory comprises:
  a first memory map to store the error corrected first demodulated data; and
  a second memory map different from the first memory map, to store the error corrected second demodulated data.

8. The combined DVD/CD data processor as claimed in claim 7, wherein said first memory map provides a VBR (variable bit rate) control margin to interface the error corrected first demodulated data with an audio/video decoder.

9. The combined DVD/CD data processor as in claim 7, wherein said ECC decoder comprises:
  a syndrome generator to generate syndrome polynomials from the first and second demodulated data stored in said memory in accordance with the corresponding first and second code lengths and corresponding first and second correction ranges;
  an erasure constant generator to generate first and second erasure constants from corresponding first and second erasure flags;
  a modified syndrome calculator to generate first and second Forney syndrome polynomials and first and second erasure polynomials from the corresponding first and second erasure constants and the corresponding syndrome polynomials;
  a modified Euclidean algorithm to process the first and second Forney syndrome polynomials with the corresponding first and second erasure polynomials, to generate corresponding first and second errata locator polynomials and corresponding first and second errata evaluator polynomials; and
  a Chien search and error correction unit to correct errors of the first and second demodulated data stored in said memory according to the corresponding first and second errata locator polynomials and the corresponding first and second errata evaluator polynomials.

10. The combined DVD/CD data processor as claimed in claim 7, further comprising:
  a descrambler to descramble the error corrected first demodulated data stored in said memory for use with an audio/video decoder; and
  an audio processor to audio process the error corrected second demodulated data stored in said memory.

11. A combined DVD (Digital Video Disk)/CD (Compact Disk) data processor to process first and second pulse streams from a DVD and a CD, respectively, comprising:
  a single demodulator to demodulate the first and second pulse streams in a DVD mode and a CD mode, respectively, to generate first and second demodulated data, respectively;
  a memory to store the first and second demodulated data; and
  an ECC (error checking and correction) decoder to error correct the first demodulated data stored in said memory in accordance with a first predetermined code length and error correction range in the DVD mode, and to error correct the second demodulated data stored in said memory in accordance with a second predetermined code length and error correction range in the CD mode, wherein:
    said memory stores the error corrected first demodulated data output from said ECC decoder in a first memory map, and the error corrected second demodulated data output from said ECC decoder in a second memory map different from the first memory map.

12. The combined DVD/CD data processor as claimed in claim 11, further comprising:
  a descrambler to descramble the error corrected first demodulated data stored in said memory for use with an audio/video decoder; and
  an audio processor to audio process the error corrected second demodulated data stored in said memory.

13. The combined DVD/CD data processor as claimed in claim 11, further comprising:
  a PLL (Phase Locked Loop) to receive the first and second pulse streams, to generate respective first and second PLL clocks; and
  a frame/ID (identification) synchronization detector to latch the first and second pulse streams according to the respective first and second PLL clocks, to generate respective first and second symbol clocks;
  wherein said demodulator performs a first type of demodulation on the first pulse stream according to the first symbol clock to generate the first demodulated data in the DVD mode, and a second type of demodulation on the second pulse stream according to the second symbol clock to generate the second demodulated data in the CD mode.

14. A combined DVD (Digital Video Disk)/CD (Compact Disk) data processor to process first and second pulse streams from a DVD and a CD, respectively, comprising:
  a demodulator to demodulate the first and second pulse streams in a DVD mode and a CD mode, respectively, to generate first and second demodulated data, respectively;
  a single external memory to store the first and second demodulated data; and
  a single ECC (error checking and correction) decoder to error correct the first and second demodulated data stored in said memory, wherein said single ECC decoder error corrects the first and second demodulated data stored in said memory in accordance with corresponding different code lengths and correction ranges; wherein:
    said memory comprises a first memory map including a plurality of blocks of the error corrected data each having a first fixed number of bytes in the DVD mode, and a second memory map including a plurality of frames of the error corrected data each having a second fixed number of bytes in the CD mode.

15. The combined DVD/CD data processor as claimed in claim 14, further comprising:

a descrambler to descramble the error corrected first demodulated data for use with an audio/video decoder; and an audio processor to audio process the error corrected second demodulated data.

16. The combined DVD/CD data processor as claimed in claim 14, further comprising:

a PLL (Phase Locked Loop) to receive the first and second pulse streams, to generate respective first and second PLL clocks; and a frame/ID (identification) synchronization detector to latch the first and second pulse streams according to the respective first and second PLL clocks, to generate respective first and second symbol clocks;

wherein said demodulator performs a first type of demodulation on the first pulse stream according to the first symbol clock to generate the first demodulated data in a DVD mode, and a second type of demodulation on the second pulse stream according to the second symbol clock to generate the second demodulated data in a CD mode.

17. A data processor apparatus for common use in a DVD (Digital Video Disk)/CD (Compact Disk) player using discrimination information provided according to a DVD or a CD, comprising:

a single pre-processor generating a clock from a pulse stream read from one of the DVD and the CD and performing demodulation of the pulse stream according to the discrimination information and the generated clock;

a memory unit storing the demodulated pulse stream processed by the single pre-processor as data in a corresponding format according to the discrimination information; and a data processor and converter processing the data stored in the memory unit;

wherein:

the data processor and converter comprises an error corrector error-correcting the data stored in the memory unit according to the discrimination information using a preset error correcting method; and the data processor and converter audio-converts or data-converts the processed data according to the discrimination information; and the memory comprises a first memory map including a plurality of blocks of the error corrected data each having a first fixed number of bytes in a DVD mode, and a second memory map including a plurality of frames of the error corrected data each having a second fixed number of bytes in a CD mode.

18. The data processor apparatus as claimed in claim 17, wherein the preset error correcting method of the error corrector depends on a code length and a correcting range according to the discrimination information.

19. The data processor apparatus as claimed in claim 17, wherein the memory unit comprises:

a data storage memory; and a memory controller controlling the memory to store the data in the corresponding format according to the discrimination information.

20. A combined DVD (Digital Video Disk)/CD (Compact Disk) data processor to process a pulse stream of data from a DVD or a CD, comprising:

a PLL (Phase Locked Loop) to receive the pulse stream, to generate a PLL clock;

a frame/ID (identification) synchronization detector to latch the pulse stream according to said PLL clock, to generate a symbol clock;

a demodulator to EFM+ demodulate the pulse stream according to the symbol clock in a DVD mode, and EFM demodulate the pulse stream according to the symbol clock in a CD mode, to generate demodulated data;

a memory to store the demodulated data from said demodulator;

a single ECC (error checking and correction) decoder to error-correct the demodulated data stored in said memory according to a predetermined code length and error correction range, the predetermined code length and error correction range having different values in the DVD and CD modes, to generate error corrected data;

a descrambler to descramble the error corrected data stored in said memory, in the DVD mode; and a CD audio processor to process the error corrected data stored in said memory, in the CD mode, wherein said memory has a first memory map including a plurality of blocks of the error corrected data each having a first fixed number of bytes in the DVD mode, and a second memory map including a plurality of frames of the error corrected data each having a second fixed number of bytes in the CD mode.

21. The combined DVD/CD processor as claimed in claim 20, wherein:

the plurality of blocks is 13;

the first fixed number of bytes is 32.25 Kbytes;

the plurality of frames is 256; and the second fixed number of bytes is 32 bytes.

22. A combined DVD (Digital Video Disk)/CD (Compact Disk) data processor to process first and second pulse streams from a DVD and a CD, respectively, comprising:

a PLL (Phase Locked Loop) to receive the first and second pulse streams, to generate respective first and second PLL clocks;

a frame/ID (identification) synchronization detector to latch the first and second pulse streams according to the respective first and second PLL clocks, to generate respective first and second symbol clocks;

a demodulator to perform a first type of demodulation on the first pulse stream according to the first symbol clock to generate first demodulated data of a DVD mode, and a second type of demodulation on the second pulse stream according to the second symbol clock to generate second demodulated data of a CD mode;

a memory to store the first and second demodulated data; and a single ECC (error checking and correction) decoder to error correct the first demodulated data stored in said memory in accordance with a first predetermined code length and error correction range and to store the error corrected first demodulated data back in said memory, and to error correct the second demodulated data stored in said memory in accordance with a second predetermined code length and error correction range and to store the error corrected second demodulated data back in said memory, wherein said memory comprises:

a first memory map to store the error corrected second demodulated data; and a second memory map different from the first memory map, to store the error corrected second demodulated data.

23. The combined DVD/CD data processor as claimed in claim 22, wherein said first memory map provides a VBR (variable bit rate) control margin to interface the error corrected first demodulated data with an audio/video decoder.

24. A combined DVD (Digital Video Disk)/CD (Compact Disk) data processor to process first and second pulse streams from a DVD and a CD, respectively, comprising:
- a demodulator to demodulate the first and second pulse streams in a DVD and a CD mode, respectively, to generate first and second demodulated data, respectively;
- a memory to store the first and second demodulated data; and
- a single ECC (error checking and correction) decoder to error correct the first demodulated data stored in said memory in accordance with a first predetermined code length and error correction range in the DVD mode, and to error correct the second demodulated data stored in said memory in accordance with a second predetermined code length and error correction range in the CD mode,
- wherein said memory stores the error corrected first demodulated data output from said ECC decoder in a first memory map, and the error corrected second demodulated data output from said ECC decoder in a second memory map different from the first memory map.

25. A combined DVD (Digital Video Disk)/CD (Compact Disk) data processor to process first and second pulse streams from a DVD and a CD, respectively, comprising:
- a single demodulator to demodulate the first and second pulse streams in a DVD mode and a CD mode, respectively, to generate first and second demodulated data, respectively;
- an external memory to store the first and second demodulated data; and
- a single ECC (error checking and correction) decoder to error correct the first and second demodulated data stored in said memory;
- wherein:
  - said single ECC decoder error corrects the first and second demodulated data stored in said memory in accordance with corresponding different code lengths and correction ranges, and
  - said memory comprises a first memory map including a plurality of blocks of the first error corrected demodulated data each having a first fixed number of bytes in a DVD mode, and a second memory map including a plurality of frames of the error corrected data each having a second fixed number of bytes in the CD mode.

26. The combined DVD/CD data processor as claimed in claim 25, further comprising:
- a descrambler to descramble the error corrected first demodulated data for use with an audio/video decoder; and
- an audio processor to audio process the error corrected second demodulated data.

* * * * *

UNITED STATES PATENT AND TRADEMARK OFFICE
CERTIFICATE OF CORRECTION

PATENT NO. : 6,895,173 B2
DATED : May 17, 2005
INVENTOR(S) : Hoon-Soon Choi

It is certified that error appears in the above-identified patent and that said Letters Patent is hereby corrected as shown below:

Column 5,
Line 60, after "comprises" replace ";" with -- : --.

Column 7,
Line 29, after "as" insert -- claimed --.

Column 11,
Line 10, after "DVD" insert -- mode --.

Signed and Sealed this

Thirty-first Day of January, 2006

JON W. DUDAS
*Director of the United States Patent and Trademark Office*